(12) United States Patent
Afsharian et al.

(10) Patent No.: US 10,832,858 B2
(45) Date of Patent: Nov. 10, 2020

(54) HIGH-FREQUENCY TRANSFORMER DESIGN FOR DC/DC RESONANT CONVERTERS

(71) Applicant: Murata Manufacturing Co., Ltd., Nagaokakyo (JP)

(72) Inventors: Jahangir Afsharian, Markham (CA); Bing Gong, Markham (CA); Hussain S. Athab, Markham (CA)

(73) Assignee: MURATA MANUFACTURING CO., LTD., Kyoto (JP)

( * ) Notice: Subject to any disclaimer, the term of this patent is extended or adjusted under 35 U.S.C. 154(b) by 199 days.

(21) Appl. No.: 15/548,947

(22) PCT Filed: Mar. 29, 2016

(86) PCT No.: PCT/US2016/024657
§ 371 (c)(1),
(2) Date: Aug. 4, 2017

(87) PCT Pub. No.: WO2016/160775
PCT Pub. Date: Oct. 6, 2016

(65) Prior Publication Data
US 2018/0068782 A1 Mar. 8, 2018

Related U.S. Application Data

(60) Provisional application No. 62/139,906, filed on Mar. 30, 2015.

(51) Int. Cl.
*H01F 27/34* (2006.01)
*H01F 27/28* (2006.01)
(Continued)

(52) U.S. Cl.
CPC ....... *H01F 27/346* (2013.01); *H01F 27/2804* (2013.01); *H01F 27/29* (2013.01);
(Continued)

(58) Field of Classification Search
CPC ........ H01F 27/346; H01F 27/29; H01F 27/40; H01F 2027/065; H01F 17/0013;
(Continued)

(56) References Cited

U.S. PATENT DOCUMENTS 6,366,486 B1 * 4/2002 Chen ................. H02M 3/00
361/707
6,927,661 B2 * 8/2005 He ................... H01F 27/2804
29/602.1

(Continued)

OTHER PUBLICATIONS

Official Communication issued in International Patent Application No. PCT/US2016/024657, dated Jun. 30, 2016.

*Primary Examiner* — Shawki S Ismail
*Assistant Examiner* — Demetries A Gibson
(74) *Attorney, Agent, or Firm* — Keating & Bennett, LLP

(57) ABSTRACT

A transformer assembly includes a transformer with primary windings located on multiple layers and with secondary windings interleaved with the multiple layers and includes a substrate connected to the transformer and with a first transistor with first, second, and third terminals, in which the first terminal is connected to the secondary windings, the second terminal is connected to an output terminal of the transformer assembly, and the third terminal is a control terminal; first conductive layers; second conductive layers interleaved with the first conductive layers; a first via that is solid filled and that connects the first conductive layers and the first terminal; and a second via that is solid filled and that connects the second conductive layers and the second terminal.

20 Claims, 5 Drawing Sheets

(51) Int. Cl.

| | |
|---|---|
| *H01F 27/40* | (2006.01) |
| *H01F 27/29* | (2006.01) |
| *H02M 3/335* | (2006.01) |
| *H05K 1/11* | (2006.01) |
| *H05K 1/18* | (2006.01) |
| *H05K 7/20* | (2006.01) |
| *H02M 1/00* | (2006.01) |
| *H01F 27/06* | (2006.01) |

(52) U.S. Cl.
CPC ........ *H01F 27/40* (2013.01); *H02M 3/33592* (2013.01); *H05K 1/111* (2013.01); *H05K 1/181* (2013.01); *H05K 7/209* (2013.01); *H01F 2027/065* (2013.01); *H01F 2027/2819* (2013.01); *H02M 3/335* (2013.01); *H02M 2001/0058* (2013.01); *H05K 2201/1003* (2013.01); *Y02B 70/1433* (2013.01); *Y02B 70/1491* (2013.01)

(58) Field of Classification Search
CPC ........ H01F 2027/2819; H01F 27/2804; H02M 3/33592; H02M 3/335; H02M 7/003; H05K 1/111; H05K 1/181; H05K 7/209; H05K 2201/1003; H05K 1/165; H01L 41/083–41; H01L 41/0838
See application file for complete search history.

(56) References Cited

U.S. PATENT DOCUMENTS

| | | | |
|---|---|---|---|
| 7,705,705 B2 | 4/2010 | Zeng et al. | |
| 8,344,842 B1* | 1/2013 | Luzanov | H05K 1/141 336/192 |
| 8,786,067 B2* | 7/2014 | Paek | H01L 25/0657 257/686 |
| 8,964,410 B2* | 2/2015 | Chang | H05K 1/18 336/123 |
| 2005/0270806 A1* | 12/2005 | Zhu | H02M 3/33576 363/17 |
| 2006/0225916 A1* | 10/2006 | Nelson | H01L 23/49838 174/255 |
| 2007/0075700 A1 | 4/2007 | Nakahori | |
| 2007/0152795 A1 | 7/2007 | Leng et al. | |
| 2009/0085702 A1 | 4/2009 | Leng et al. | |
| 2010/0033282 A1 | 2/2010 | Hsu et al. | |
| 2010/0207714 A1 | 8/2010 | Lai et al. | |
| 2010/0265029 A1 | 10/2010 | Xiong et al. | |
| 2011/0018676 A1 | 1/2011 | Young et al. | |
| 2011/0267844 A1 | 11/2011 | He et al. | |
| 2012/0038448 A1 | 2/2012 | Kim et al. | |
| 2012/0081202 A1* | 4/2012 | Nanayakkara | H01F 19/04 336/200 |
| 2012/0235780 A1* | 9/2012 | Maple | H01F 27/2847 336/207 |
| 2013/0188329 A1* | 7/2013 | Chang | H05K 1/18 361/836 |
| 2015/0130578 A1* | 5/2015 | Eom | H01F 27/2804 336/192 |
| 2015/0155086 A1* | 6/2015 | Matsuura | H02M 3/28 363/17 |
| 2015/0162448 A1* | 6/2015 | Raghavan | H01L 29/7869 257/43 |
| 2016/0099215 A1* | 4/2016 | Toda | H01L 21/76879 257/774 |
| 2018/0191235 A1* | 7/2018 | Chen | H01F 27/28 |

* cited by examiner

US 10,832,858 B2

HIGH-FREQUENCY TRANSFORMER DESIGN FOR DC/DC RESONANT CONVERTERS

BACKGROUND OF THE INVENTION

1. Field of the Invention

The present invention relates to DC/DC resonant converters. More specifically, the present invention relates to high-frequency transformer design for DC/DC resonant converters.

2. Description of the Related Art

A half-bridge LLC converter is shown in FIG. 1. The half-bridge LLC converter shown in FIG. 1 can be used either with the known transformers discussed in this section or with the novel transformers according to the preferred embodiments of the present invention discussed in the Detailed Description of Preferred Embodiments section below.

FIG. 1 shows a typical application of a half-bridge DC-DC converter using an LLC series resonant circuit. In FIG. 1, "primary side" refers to the portion of the circuit on the left-hand side of the transformer connected to the primary windings, and "secondary side" refers to the portion of the circuit on the right-hand side of the transformer connected to the secondary windings. LLC refers to the passive components capacitor $C_1$, inductor $L_{rt}$, and inductor $L_{mt}$ connected to the primary side of the transformer. MOSFETs Q1 and Q2 are connected to the primary side of the transformer and to input voltage $V_i$. The power-switch MOSFETs Q3, Q4 are connected to the secondary side of the transformer as synchronous rectifiers (SRs). Each of the MOSFETs Q3, Q4 could be a single MOSFET (as shown in FIG. 1) or could be multiple MOSFETS connected in parallel (not shown in FIG. 1). MOSFETSs connected in parallel means that the drains of the MOSFETS are connected together and that the sources of the MOSFETS are connected together. Output capacitor $C_O$ is connected to the secondary side of the transformer.

The design of the transformer should be considered in high-power and high-current applications. To achieve high power density, a high switching frequency is used to reduce the size of the magnetic components, and high-frequency transformers should be designed with care. At high frequency, the skin depth effect and the proximity effect should be considered in designing the winding of the transformer. The skin depth effect and the proximity effect can generate large AC loss and large DC resistance loss. Further, the connection between the transformer's secondary windings and the MOSFETs Q3, Q4 should also be considered. The distance between the secondary windings and the SRs, i.e., MOSFETs Q3, Q4, should be reduced to reduce the parasitic impedance from the wires and ultimately to reduce termination loss.

In U.S. 2007/0152795 A1, U.S. Pat. No. 7,705,705 B2, and U.S. 2009/0085702 A1, the transformer structure 100 includes primary and secondary windings connected in parallel so that a desired output-power rating can be achieved. As shown in FIG. 2, the power converter includes multiple secondary-circuit units 110, and each secondary-circuit unit 111 includes a printed circuit board (PCB) 111 with a secondary winding 112. The PCB 111 includes an output rectifier circuit and a capacitive filter. Core 113 includes top core portion 114 and bottom core portion 115. The secondary-circuit units 110 are stacked on top of each other such that central legs of the top core portion 114 and the bottom core portion 115 can be inserted into holes in the PCB 111 and the secondary winding 112. The secondary-circuit units 110 are connected parallel to the output load. Although this known transformer structure can achieve high efficiency, the total size of the transformer assembly is considerably large.

In U.S. 2010/0265029 A1, cylindrical conductive posts 63a, 63b, 63c connect multiple secondary windings 6, as shown in FIG. 3 of this application, which corresponds to FIG. 6B of U.S. 2010/0265029 A1. Secondary windings 6 includes a bobbin base 60, three bobbins 61, four winding structures 62a, 62b, 62c, 62d, three conductive posts 63a, 63b, 63c and a core set 64. Although this known structure can achieve high power density, high efficiency is difficult to achieve because of the large termination losses that occur because the distances between the secondary windings and the synchronous rectifiers are not uniform.

In U.S. 2010/0207714 A1, the internal winding of a transformer dissipates the heat of the transformer, as shown in FIG. 4, which corresponds to FIG. 2C of U.S. 2010/0207714 A1. The transformer 2 includes a magnetic device 21 and a case 22. The magnetic device 21 includes a winding member and a magnetic core assembly. The winding member includes a primary winding assembly 211a and a secondary winding assembly 211b. The primary winding assembly 211a and the secondary winding assembly 211b are made of copper foils. For isolation and insulation, an insulating tape 211d is wound around the outer periphery of the transformer 2. The primary winding assembly 211a is produced by circularly winding a copper foil, and thus, a channel 211c is defined in the center of the primary winding assembly 211a. The transformer 2 further includes a positioning plate 23. The area of the positioning plate 23 is greater than the bottom area of the case 22. The magnetic device 21 includes at least one pin 213. An end of the pin 213 is connected to the positioning plate 23 and the winding member 211. The case 22 includes a first side plate 223. Several bolt holes 223a are included in the first side plate 223 of the case 22. Another heat-dissipating device (e.g. a water cooling device or a heat sink) can be attached to the first side plate 223 of the case 22 by inserting bolts or screws into corresponding holes 223a. The heat generated by the magnetic device 21 is transferred to the case 22 through the thermally conductive adhesive 24 and then quickly dissipated away by the heat-dissipating device so that the heat-dissipating efficiency is enhanced. The case 22 acts as a heat sink, and the thermally conductive adhesive 24 transfers the heat from the winding member to the case 22 and then to air.

High-power-density, high-frequency transformer design includes the following challenges:
1) Heat dissipation of the windings and synchronous rectifiers.
2) Losses caused by high-frequency skin-depth effect and proximity effect.
3) Voltage spike on the drain to source of the MOSFETs Q3, Q4 created by the large leakage inductance of the transformer between the top secondary winding Ns1 and the bottom secondary winding Ns2 resonating with the parasitic capacitances of the MOSFETs Q3, Q4.

SUMMARY OF THE INVENTION

To overcome the problems described above, preferred embodiments of the present invention provide a transformer with one or more of the following features:

1) Very good heat dissipation without a heat sink, which results in a smaller size.
2) Reduction of the losses caused by high-frequency skin-depth effect and proximity effect achieved by proper interleaving of the windings.
3) Reduction of termination losses by significantly reducing or minimizing the distance between the secondary winding and output-rectifier PCB.
4) Low voltage spike on drain to source of MOSFETs Q3 and Q4 by reducing the leakage inductance between the secondary winding Ns1, Ns2 of the transformer.

According to a preferred embodiment of the present invention, a transformer assembly includes a transformer with primary windings located on multiple layers and with secondary windings interleaved with the multiple layers and includes a substrate connected to the transformer and with a first transistor with first, second, and third terminals, in which the first terminal is connected to the secondary windings, the second terminal is connected to an output terminal of the transformer assembly, and the third terminal is a control terminal; first conductive layers; second conductive layers interleaved with the first conductive layers; a first via that is solid filled and that connects the first conductive layers and the first terminal; and a second via that is solid filled and that connects the second conductive layers and the second terminal.

The first and second vias preferably extend downward directly under the first transistor. The transformer further preferably includes a bus bar that is located on a second surface of the substrate opposite to a first surface of the substrate on which the first transistor is located and that is connected to the second via.

The secondary windings preferably include output terminals that are soldered to the substrate. The output terminals are preferably soldered to pads on the substrate. The secondary winding is preferably center tapped. The multiple layers preferably include printed circuit boards. More than one primary winding is preferably located on each of the multiple layers.

The first transistor is preferably a MOSFET. Preferably, the first terminal is a drain of the MOSFET, the second terminal is a source of the MOSFET, and the third terminal is a gate of the MOSFET. The transformer preferably further includes a magnetic core. Preferably, heat generated by the first transistor is dissipated by the first and second vias, and the first transistor is not connected to a heatsink other than the first and second vias. Preferably, the substrate further includes a second transistor, and the first and second transistors are synchronous rectifiers.

According to a preferred embodiment of the present invention, a converter assembly includes a host substrate including a primary-side circuit and a transformer according to various other preferred embodiments of the present invention connected to the host substrate. The primary-side circuit is connected to the primary windings of the transformer.

The first and second vias preferably extend downward directly under the first transistor. The converter assembly further preferably includes a bus bar that is located on a second surface of the substrate opposite to a first surface of the substrate on which the first transistor is located and that is connected to the second via. The secondary windings preferably include output terminals that are soldered to the substrate. The output terminals are preferably soldered to pads on the substrate. The primary-side circuit preferably includes first and second primary-side transistors connected to an input voltage. Preferably, the substrate further includes a second transistor, and the first and second transistors are synchronous rectifiers.

The above and other features, elements, characteristics, steps, and advantages of the present invention will become more apparent from the following detailed description of preferred embodiments of the present invention with reference to the attached drawings.

DETAILED DESCRIPTION OF PREFERRED EMBODIMENTS

Figure 5:
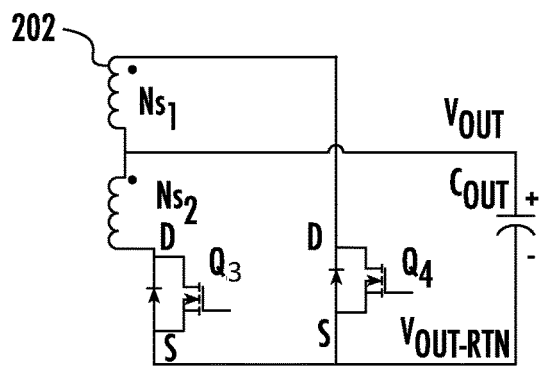
FIG. 5 is a circuit diagram of an output-rectifier circuit of the transformer.
Figure 10:
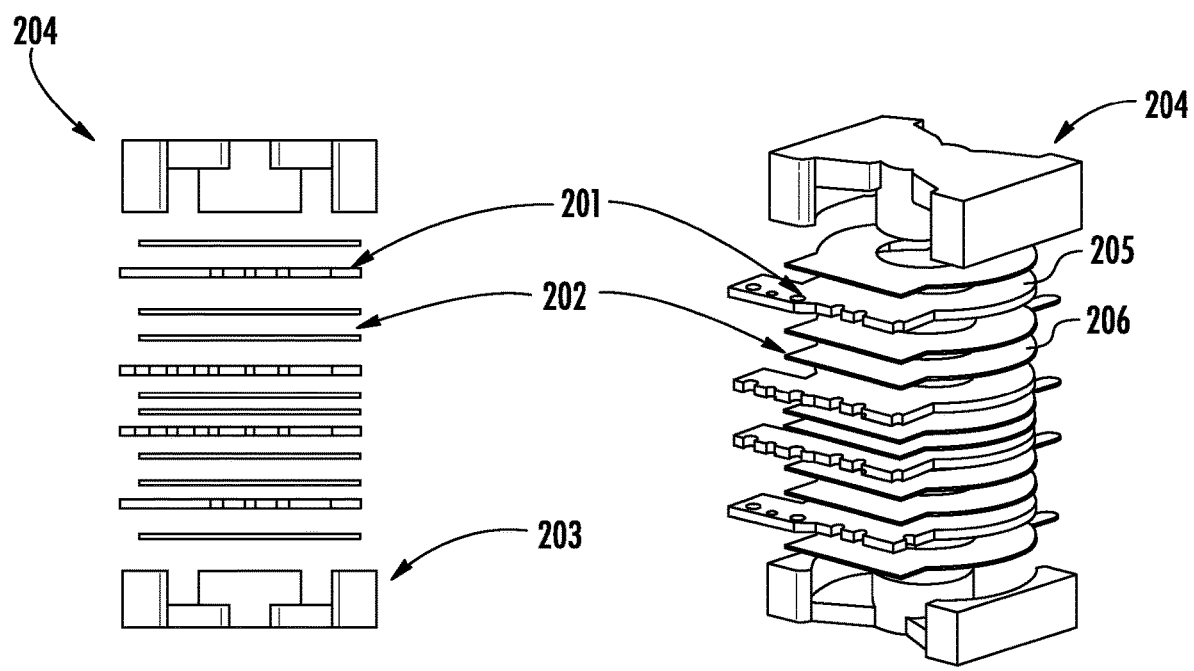
FIG. 10 is an exploded view of the structure of the transformer.
Figure 11:
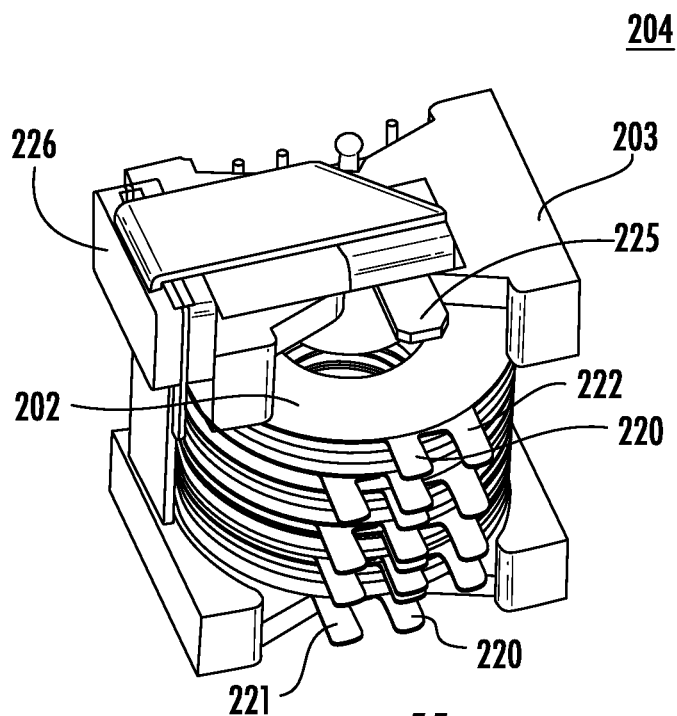
FIG. 11 shows a transformer.
Figure 12:
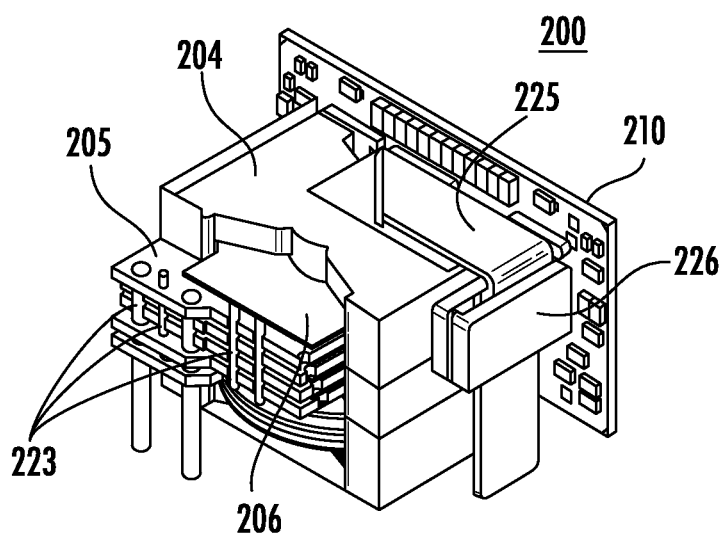
FIG. 12 shows a transformer assembly with the transformer shown in FIG. 11 connected to the output-rectifier PCB shown in FIGS. 7, 8, and 9.

Preferred embodiments of the present invention relate to high-frequency transformer design for DC/DC resonant converters such as parallel LC, LLC, LCLC, etc. FIG. 5 is a circuit diagram of the secondary-side of a DC/DC resonant converter. FIG. 12 shows the transformer assembly 200 that implements that circuit shown in FIG. 5. The transformer assembly 200 includes transformer 204 and output-rectifier PCB 210. The output rectifier PCB 210 can be any suitable substrate. FIGS. 6-9 shows the output-rectifier PCB 210. FIGS. 10 and 11 show the transformer 204 with primary windings 201, secondary windings 202, and magnetic core 203. As shown in FIG. 10, the primary windings 201 can be located on multiple PCBs 205 and the secondary windings 202 can be made of stamped copper 206. The primary windings 201 do not have to be located on PCBs 205. The primary windings 201 can, for example, be made of Litz wire. The secondary windings do not have to be made of stamped copper. The secondary windings 202 can be made of any suitable material with high electrical conductivity, including, for example, silver or a silver alloy.

To reduce the losses on the primary winding 201, the number of turns on each PCB 204 should be significantly reduced or minimized. For example, as shown in FIG. 10, in a 16-turn primary winding 201 and a 1-turn secondary winding 202, each of four PCBs P1, P2, P3, P4 can have four turns for a total of 16 turns. It is possible to use a different number of turns on the PCBs 205 and to use a different number of turns in the primary winding 201 and in the secondary winding 202. The PCBs 205 with the primary windings 201 are preferably connected in series.

The secondary winding 202 is preferably center tapped as shown in FIG. 5. Center tapping is sometimes used for low-voltage, high-current output applications. For high-current applications, center-tapped secondary winding $Ns_1$, $Ns_2$ are preferably multiple windings connected in parallel. As shown in FIG. 10, the transformer 204 can include four windings $S_{top}$ that correspond to secondary windings $Ns_1$, and four windings $S_{bottom}$ that correspond to secondary windings $Ns_2$. When connected on the output-rectifier PCB 210, the windings $S_{top}$ are connected in parallel, and the windings $S_{bottom}$ are connected in parallel.

Figure 6:
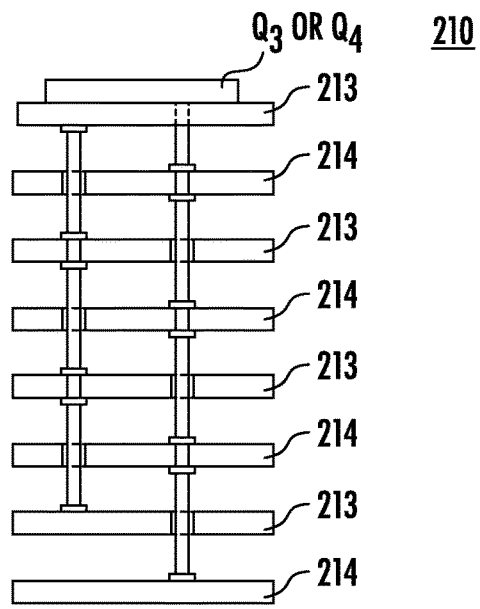
FIG. 6 is a cross-sectional view of the PCB of the output-rectifier circuit.
Figure 7:
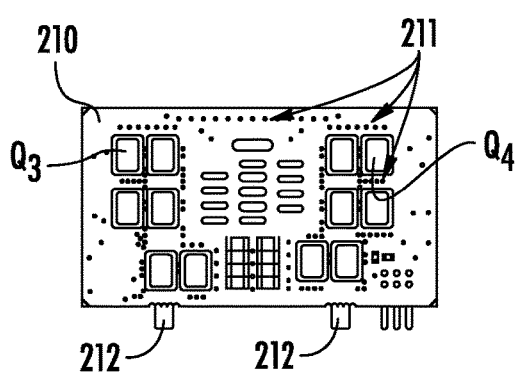
FIGS. 7, 8, and 9 show an output-rectifier PCB.

FIG. 6 shows the layers of the output-rectifier PCB 210 with MOSFETs Q3 or Q4. In FIG. 5, the terminal D is the drain terminal of the MOSFET Q3 or Q4, and terminal S is the source terminal of the MOSFET Q3 or Q4. MOSFETs Q3 or Q4 could be a single MOSFET or multiple MOSFETS in parallel. For example, FIG. 7 shows six MOSFETs Q3 and six MOSFETs Q4. In FIG. 7, for clarity, only one MOSFET Q3 and only one MOSFET Q4 are labeled. Any suitable transistor can be used instead of MOSFETs. As shown in FIG. 6, the output-rectifier PCB 210 includes multiple drain and source layers 213, 214 to provide the required load current. The drain layers 213 are dedicated to the drain, and the source layers 214 are dedicated to the source. As shown in FIG. 6, the source and drain layers 213, 214 can be stacked alternatively. Because the drain and source layers 213, 214 are symmetrically interleaved, the current is equally shared among the parallel drain and source layers 213, 214.

For high-frequency applications, the thickness of the copper in each drain and source layers 213, 214 must be selected properly to reduce the DC and AC losses caused by the skin effect and proximity effect. The distance between the drain and source layers 213, 214 should maintain a small drain-to-source capacitance. For example, the minimum distance between the drain and source layers 213, 214 should be about 5 mils. For a 1600 W, 12 V output converter, the thickness of each copper layer preferably is about 2 oz, where 2 oz corresponds to the thickness of 2 oz of copper rolled out to an area of 1 ft$^2$, and the total thickness of the output-rectifier PCB 210 preferably is about 1.5 mm, for example. If higher power is required, then approximately 3 oz copper can be used, or the number of drain and source layers 213, 214 can be increased, for example.

Vias 211 filled with a conductive material are used to interconnect the drain and source layers 213, 214. As shown in FIG. 6, the vias 211 extend downward, directly underneath the MOSFETs Q3, Q4. The solid conductive material of the vias 211 significantly reduces the impedance and the heat generated when large currents are conducted through the vias 211. The solid conductive material of the vias 211 can transport heat from the MOSFET Q3, Q4 to the other side of the output-rectifier PCB 210 like a radiator.

Figure 8:
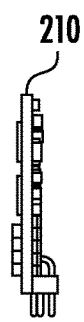
Figure 9:
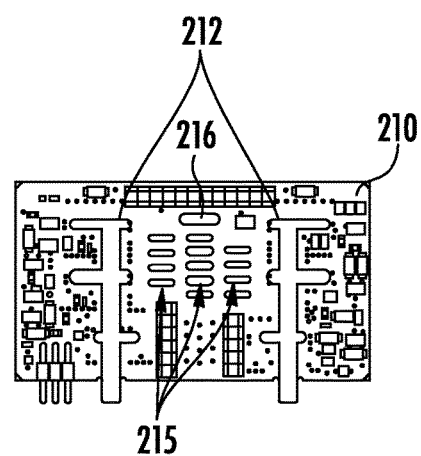

As shown in FIGS. 7, 8, and 9, bus bars 212 connect the source layers 214 of the MOSFETs Q3 or Q4 and the terminal Vout_RTN (terminal Vout_RTN is shown in FIG. 5). The bus bars 212 collect the source current and provides the source current to the terminal Vout_RTN with lower conduction losses. The terminal Vout is connected to the output bus bar 225 (the output bus bar 225 is shown in FIG. 11). The bus bars 212 dissipate heat produced by the components, including the MOSFETs Q3, Q4, on the output-rectifier PCB 210. The bus bars 212 are preferably located on the opposite side of the MOSFETs Q3, Q4 where the vias 212 connect the source of MOSFETs Q3 or Q4 to the bus bars 212 so that the bus bars 212 effectively remove the heat from MOSFETs Q3 or Q4. Thus, a heat sink is not required, which saves space and cost.

The heat generated from AC loss is reduced by interleaving the windings and by using a small skin depth. To avoid having an external heat sink, vias 211 and a bus bar 212 are used to dissipate the heat generated by the MOSFETs Q3, Q4 and other semiconductors devices. FIGS. 7, 8, and 9 shows one non-limiting example of a possible layout of the output-rectifier PCB 210.

As shown in FIGS. 7 and 9, the output-rectifier PCB 210 includes pads 215, 216 that are used to connect the output-rectifier PCB 210 to the transformer 204. Preferably, the terminals 220, 221, 222 are soldered to corresponding pads 215, and the output bus bar 225 is soldered to pad 216.

FIG. 10 shows the transformer 204 that includes primary windings 201 on PCBs 205 connected in series and secondary windings 202 made of stamped copper 206 connected in parallel. FIG. 11 shows the transformer 204 before being connected to the output-rectifier PCB 210. The transformer 204 includes central terminals 220, left terminals 221, and right terminals 222 that can be soldered to corresponding pads 215 in the output-rectifier PCB 210. Preferably, the terminals 220, 221, 222 are not connected to pads 215 by a friction or interference fit, and the electrical connection between the terminals 220, 221, 222 is created by solder. The central terminals 220 provide the center tap of the secondary windings 202 as shown in FIG. 5, while left and right terminals 221, 222 are connected to the ends of the secondary windings 202 as also shown in FIG. 5. Although not shown in the circuits of FIGS. 1 and 5, the transformer 204 can include an integrated output inductor 226.

FIG. 12 shows the transformer assembly 200 with the transformer 204 connected to the output-rectifier PCB 210. The electrical path between the secondary windings 202 and the terminals Vout, Vout_RTN can be short and wide to lower contact resistance, which reduces conduction losses. The terminal Vout is connected to the secondary windings 202 through central terminals 220. The terminal Vout_RTN is connected to the secondary windings 202 through left and right terminals 221 or 222, MOSFETs Q3 or Q4, vias 211, and bus bars 212.

Figure 1:
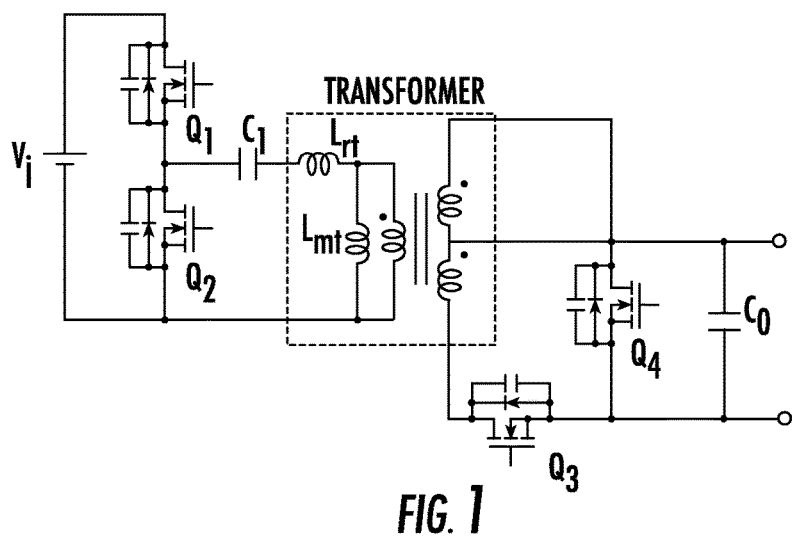
FIG. 1 is a circuit diagram of a half-bridge LLC resonant converter.
Figure 2:
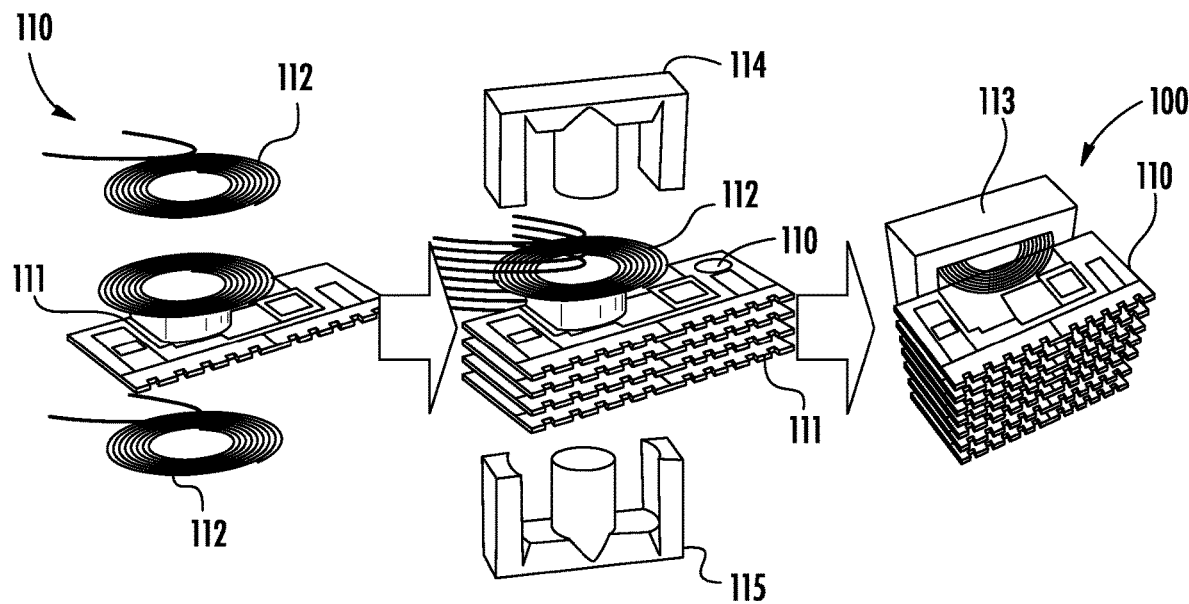
FIGS. 2-4 show known transformers.
Figure 3:
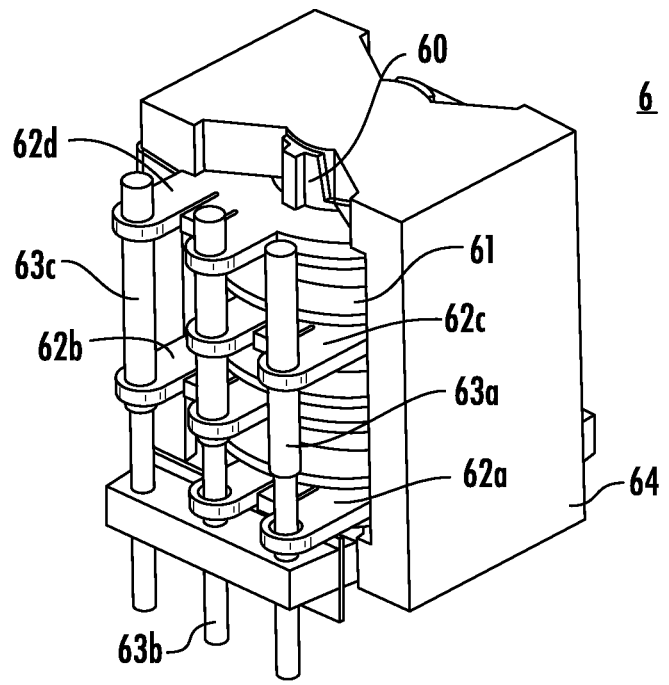
Figure 4:
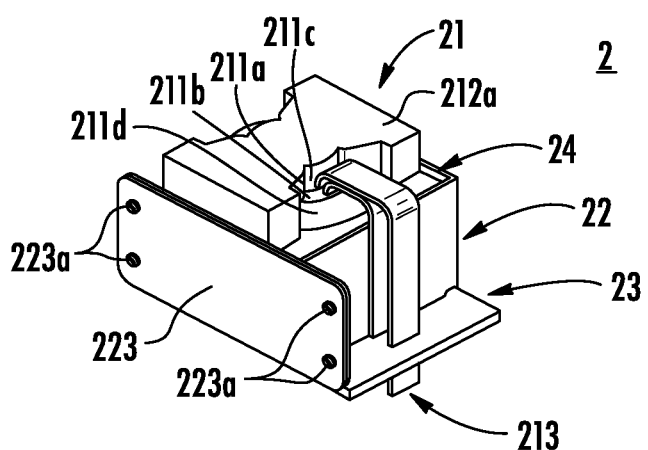

Although not shown in FIG. 12, the transformer assembly 200 can be mounted to a host PCB. The host PCB can include the primary-side circuit that can be connected to the primary windings 201 through terminals 223. The primary-side circuit can include, for example, passive components capacitor $C_1$, inductor $L_{rt}$, and inductor $L_{mt}$ and active components MOSFETs Q1, Q2 as shown in FIG. 1.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A transformer assembly comprising:
    a transformer including:
        primary windings located on multiple layers; and
        secondary windings interleaved with the multiple layers; and
    a substrate connected to the transformer and including:
        a first transistor with first, second, and third terminals, in which the first terminal is connected to the secondary windings, the second terminal is connected to an output terminal of the transformer assembly, and the third terminal is a control terminal;
        first conductive layers;
        second conductive layers interleaved with the first conductive layers;
        a first via that is solid filled and that connects the first conductive layers and the first terminal; and
        a second via that is solid filled and that connects the second conductive layers and the second terminal.

2. The transformer assembly of claim 1, wherein the first and second vias extend downward directly under the first transistor.

3. The transformer assembly of claim 1, further comprising a bus bar that is located on a second surface of the substrate opposite to a first surface of the substrate on which the first transistor is located and that is connected to the second via.

4. The transformer assembly of claim 1, wherein the secondary windings include output terminals that are soldered to the substrate.

5. The transformer assembly of claim 4, wherein the output terminals are soldered to pads on the substrate.

6. The transformer assembly of claim 1, wherein the secondary winding is center tapped.

7. The transformer assembly of claim 1, wherein the multiple layers include printed circuit boards.

8. The transformer assembly of claim 1, wherein more than one primary winding is located on each of the multiple layers.

9. The transformer assembly of claim 1, wherein the first transistor is a MOSFET.

10. The transformer assembly of claim 9, wherein the first terminal is a drain of the MOSFET, the second terminal is a source of the MOSFET, and the third terminal is a gate of the MOSFET.

11. The transformer assembly of claim 1, wherein the transformer further includes a magnetic core.

12. The transformer assembly of claim 1, wherein:
heat generated by the first transistor is dissipated by the first and second vias; and
the first transistor is not connected to a heatsink other than the first and second vias.

13. The transformer assembly of claim 1, wherein:
the substrate further includes a second transistor; and
the first and second transistors are synchronous rectifiers.

14. A converter assembly comprising:
a host substrate including a primary-side circuit; and
the transformer assembly of claim 1 connected to the host substrate; wherein
the primary-side circuit is connected to the primary windings of the transformer.

15. The converter assembly of claim 14, wherein the first and second vias extend downward directly under the first transistor.

16. The converter assembly of claim 14, further comprising a bus bar that is located on a second surface of the substrate opposite to a first surface of the substrate on which the first transistor is located and that is connected to the second via.

17. The converter assembly of claim 14, wherein the secondary windings include output terminals that are soldered to the substrate.

18. The converter assembly of claim 17, wherein the output terminals are soldered to pads on the substrate.

19. The converter assembly of claim 14, wherein the primary-side circuit includes first and second primary-side transistors connected to an input voltage.

20. The converter assembly of claim 14, wherein:
the substrate further includes a second transistor; and
the first and second transistors are synchronous rectifiers.

* * * * *